United States Patent
Nale (10) Patent No.: US 9,772,799 B2
(45) Date of Patent: Sep. 26, 2017

(54) MEMORY INTERFACE SIGNAL REDUCTION

(71) Applicant: INTEL CORPORATION, Santa Clara, CA (US)

(72) Inventor: Bill Nale, Livermore, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/981,307

(22) Filed: Dec. 28, 2015

(65) Prior Publication Data

US 2016/0188258 A1   Jun. 30, 2016

Related U.S. Application Data

(63) Continuation of application No. 12/974,057, filed on Dec. 21, 2010, now Pat. No. 9,251,874.

(51) Int. Cl.
  *G06F 12/00*  (2006.01)
  *G06F 3/06*   (2006.01)
  *G11C 7/10*   (2006.01)
  *G11C 7/22*   (2006.01)
  *G11C 8/18*   (2006.01)

(52) U.S. Cl.
  CPC ............ *G06F 3/0659* (2013.01); *G06F 3/061* (2013.01); *G06F 3/0673* (2013.01); *G11C 7/109* (2013.01); *G11C 7/22* (2013.01); *G11C 8/18* (2013.01); *G11C 2207/105* (2013.01)

(58) Field of Classification Search
  CPC ....... G11C 7/1078–7/1096; G11C 7/22–7/227; G11C 8/00–8/20; G11C 2207/10–2207/108
  See application file for complete search history.

(56) References Cited

U.S. PATENT DOCUMENTS

| | | |
|---|---|---|
| 5,870,350 A | 2/1999 | Bertin et al. |
| 7,802,061 B2 | 9/2010 | Qawami et al. |
| 2003/0123319 A1* | 7/2003 | Kim ...................... G11C 5/066 365/233.1 |
| 2003/0135690 A1 | 7/2003 | Lee et al. |
| 2005/0172095 A1 | 8/2005 | Choi et al. |
| 2008/0106967 A1 | 5/2008 | Oh |
| 2010/0250836 A1* | 9/2010 | Sokolov .............. G06F 12/0246 711/103 |
| 2011/0296110 A1* | 12/2011 | Lilly .................. G06F 12/0862 711/118 |

OTHER PUBLICATIONS

Notice of Preliminary Rejection mailed May 11, 2016, issued in corresponding Korean Patent Application No. 2016-7001544, 8 pages.

(Continued)

*Primary Examiner* — Nicholas Simonetti
(74) *Attorney, Agent, or Firm* — Schwabe, Williamson & Wyatt, P.C.

(57) ABSTRACT

In some embodiments a controller includes a memory activate pin, one or more combined memory command/address signal pins, and a selection circuit adapted to select in response to the memory activate pin as each of the one or more combined memory command/address signal pins either a memory command signal or a memory address signal. Other embodiments are described and claimed.

36 Claims, 6 Drawing Sheets

| New encoding | act | ras / A16 | cas / A15 | we / A14 |
|---|---|---|---|---|
| Activate | 0 | A16 | A15 | A14 |
| Read | 1 | 1 | 0 | 1 |
| Write | 1 | 1 | 0 | 0 |
| Precharge single | 1 | 0 | 1 | 0 |
| Precharge all | 1 | 0 | 1 | 0 |
| Refresh | 1 | 0 | 0 | 1 |
| MRS | 1 | 0 | 0 | 0 |
| ZQ Cal | 1 | 1 | 1 | 0 |
| not used | 1 | 0 | 1 | 1 |
| nop | 1 | 1 | 1 | 1 |

300

(56) References Cited

OTHER PUBLICATIONS

International Search Report and Written Opinion mailed Sep. 3, 2012 for PCT Application No. PCT/US2011/065670, 9 pages.
Extended European Search Report mailed Jul. 8, 2014 for European Application No. 11851426.4, 5 pages.
Supplementary European Search Report (Rule 70(2) & 70a(2) EPC) mailed Jul. 25, 2014 or European Application No. 11851426.4, 1 page.
Notice of Preliminary Rejection mailed Sep. 22, 2014 for Korean Application No. 2013-7015986, 7 pages.
Final Notice of Preliminary Rejection mailed Apr. 27, 2015, for Korean Application No. 2013-7015986, 5 pages.
International Preliminary Report on Patentability mailed Jul. 4, 2013 for PCT Application No. PCT/US2011/065670, 8 pages.
Merritt, Rick, "Rambus targets DDR DRAMs," EE Times, May 26, 2009, http:/ /www.eetimes.com/electronics-news/408319 5/ Rambustargets- DDR4-DRAMs, Retrieved Apr. 7, 2013.
Davicom, "DM9102D Single Chip Fast Ethernet NIC Controller", Davicom, May 10, 2006, Version DM9102D-DS-F01, pp. 1 and 56.
Koesler, Markus et al., "Programming a Flash-Based MSP430 Using the JTAG Interface", Texas Instruments, Feb. 2008, pp. 1 and 3.
European Search Report mailed Jan. 12, 2017, for European Application No. 16182200.2, 5 pages.

* cited by examiner

FIG 2

| New encoding | act | ras / A16 | cas / A15 | we / A14 |
|---|---|---|---|---|
| Activate | 0 | A16 | A15 | A14 |
| Read | 1 | 1 | 0 | 1 |
| Write | 1 | 1 | 0 | 0 |
| Precharge single | 1 | 0 | 1 | 0 |
| Precharge all | 1 | 0 | 1 | 0 |
| Refresh | 1 | 0 | 0 | 1 |
| MRS | 1 | 0 | 0 | 0 |
| ZQ Cal | 1 | 1 | 1 | 0 |
| not used | 1 | 0 | 1 | 1 |
| nop | 1 | 1 | 1 | 1 |

FIG 3

| New encoding | act | ras/A16 | cas/A15 | we/A14 | BG1 | BG0 | BA1 | BA0 | A17 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|---|---|---|
| Activate | 0 | A16 | A15 | A14 | BG1 | BG0 | BA1 | BA0 | A17 | A13 | A12 | A11 | A10 | A9 | A8 | A7 | A6 | A5 | A4 | A3 | A2 | A1 | A0 |
| Read | 1 | 1 | 0 | 1 | BG1 | BG0 | BA1 | BA0 | x | x | BL | A11 | AP | A9 | A8 | A7 | A6 | A5 | A4 | A3 | A2 | A1 | A0 |
| Write | 1 | 1 | 0 | 0 | BG1 | BG0 | BA1 | BA0 | x | x | BL | A11 | AP | A9 | A8 | A7 | A6 | A5 | A4 | A3 | A2 | A1 | A0 |
| Precharge single | 1 | 0 | 1 | 0 | BG1 | BG0 | BA1 | BA0 | x | x | x | x | 0 | x | A8 | A7 | A6 | A5 | A4 | A3 | A2 | A1 | A0 |
| Precharge all | 1 | 0 | 1 | 1 | x | x | x | x | x | x | x | x | 1 | x | x | x | x | x | x | x | x | x | x |
| Refresh | 1 | 0 | 0 | 1 | x | x | x | x | x | x | x | x | x | x | x | x | x | x | x | x | x | x | x |
| MRS | 1 | 0 | 0 | 0 | R3 | R2 | R1 | R0 | x | x | A12 | A11 | A10 | A9 | A8 | A7 | A6 | A5 | A4 | A3 | A2 | A1 | A0 |
| ZQ Cal | 1 | 1 | 1 | 1 | x | x | x | x | x | x | x | x | x | x | sl | x | x | x | x | x | x | x | x |
| not used | 1 | 0 | 1 | 0 | x | | | | | | | | | | | | | | | | | | |
| nop | 1 | 1 | 1 | 1 | x | x | x | x | x | x | x | x | x | x | x | x | x | x | x | x | x | x | x |

MEMORY INTERFACE SIGNAL REDUCTION

CROSS REFERENCE TO RELATED APPLICATION

The present application is a continuation of U.S. application Ser. No. 12/974,057, filed Dec. 21, 2010, and entitled "MEMORY INTERFACE SIGNAL REDUCTION" and the entire contents and disclosure of which is hereby incorporated by reference in its entirety and for all purposes.

TECHNICAL FIELD

The inventions generally relate to memory interface signal reduction.

BACKGROUND

The number of row address signals necessary on a memory interface such as a Dynamic Random Access Memory (DRAM) interface has been significantly increasing. This is due to use of higher density memories, rank multiplication, and smaller page size of memory devices, for example. A need has arisen to reduce the number of memory interface signals as much as possible.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to memory interface signal reduction.

In some embodiments a controller includes a memory activate pin, one or more combined memory command/address signal pins, and a selection circuit adapted to select in response to the memory activate pin as each of the one or more combined memory command/address signal pins either a memory command signal or a memory address signal.

Figure 1:
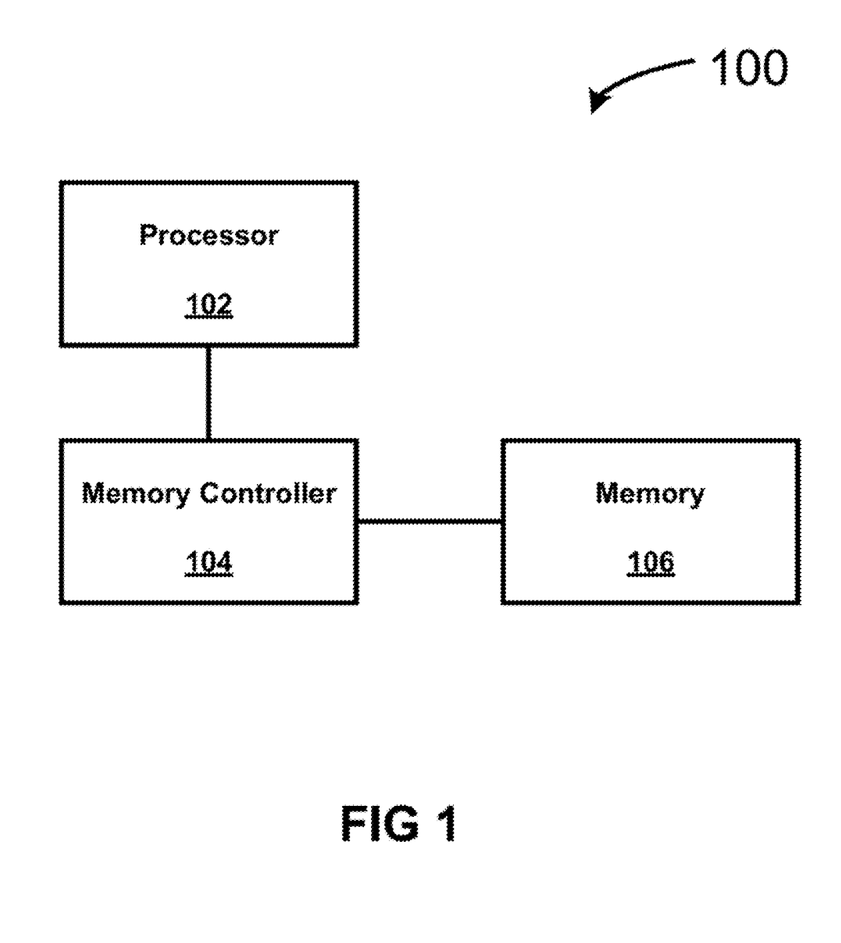
FIG. 1 illustrates a system according to some embodiments of the inventions.

FIG. 1 illustrates a system 100 according to some embodiments. In some embodiments system 100 includes a processor 102 (for example, a Central Processing Unit or CPU), a memory controller 104 (for example, a memory controller included in the processor, a memory controller on the same die as the processor, a separate integrated memory controller, a memory controller hub, an integrated memory controller hub, a graphics and memory controller hub, a platforms controller hub, a memory controller in a chipset, and/or a Dynamic Random Access Memory controller or DRAM controller, etc), and a memory 106 (for example, a DRAM, a Double Data Rate or DDR memory, and/or a DDR4 memory, etc). The memory controller 104 handles communication between the processor 102 and the memory 106.

Figure 2:
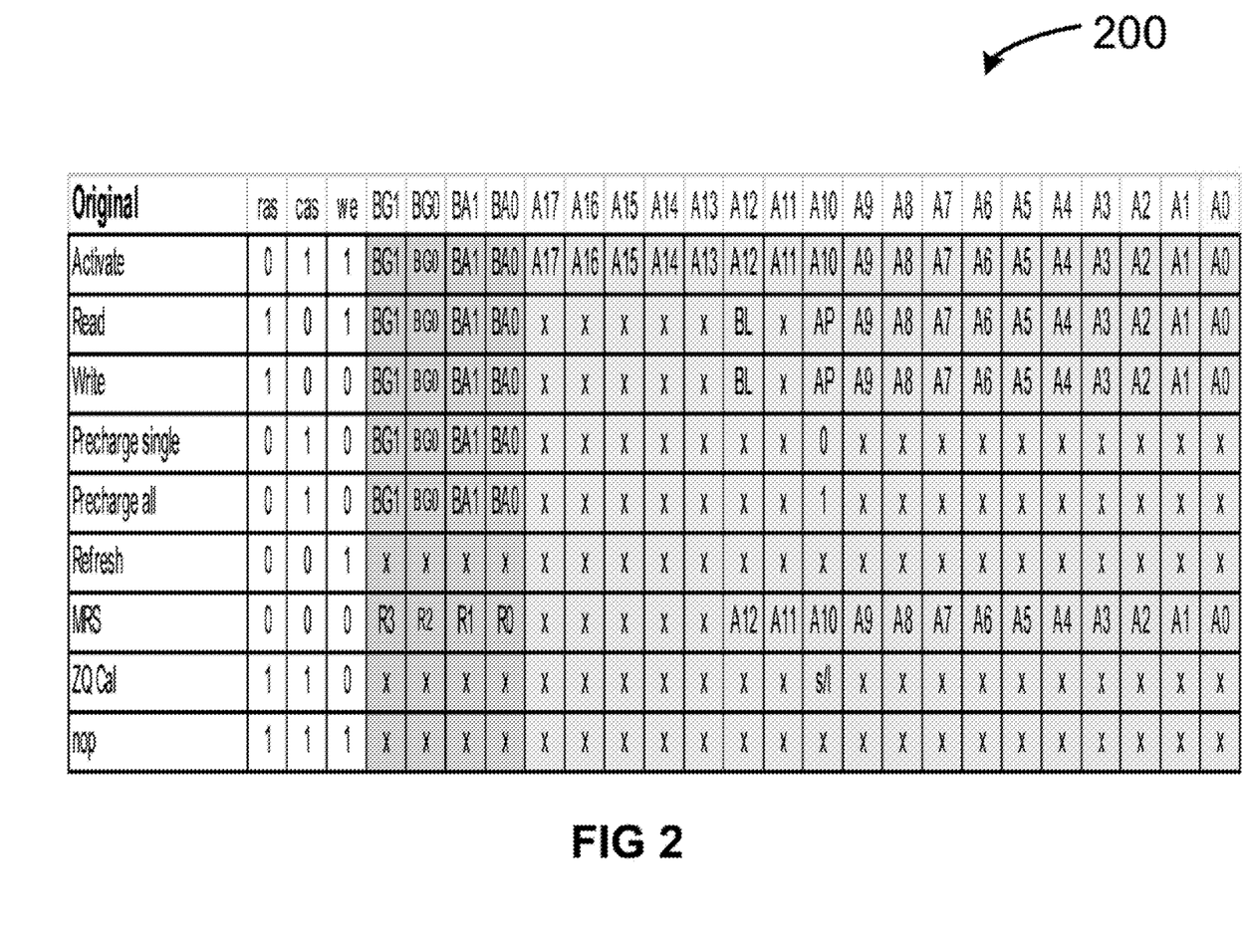
FIG. 2 illustrates a graphical representation according to some embodiments of the inventions.

FIG. 2 illustrates a graphical representation 200 of memory signals (for example, DDR4 memory signals) according to some embodiments. As illustrated in FIG. 2, the defined commands are three bits in length and use a Row Address Strobe or Row Address Select (RAS or RAS#) signal, a Column Address Strobe or Column Address Select (CAS or CAS#) signal, and a Write Enable (WE or WE#) signal.

In some embodiments, and as evident from representation 200, extra pins are required for some types of memory interface (for example, in some embodiments DDR4) which are only necessary for one command (for example, extra pins are only required for an activate command according to some embodiments). In DDR4, for example, 21 address signals A0, A1, A2, A3, . . . , A17 are defined. All 18 address signals are required for the row address at the highest density. However, only 13 of these address signals are required for any other command.

As evident from FIG. 2, 18 row address signals are required, which supports 16 Gbit memory. Additionally, it is apparent that the upper address signals (for example, A18 to A13) are used only for the activate command, and that all other commands use far fewer bits (read and write commands use 13 bits rather than all 18 bits, for example). All commands represented in FIG. 2 use a three bit command encoding. It is noted that this is left over (but expanded) from the asynchronous ("Strobe") DRAM days. While it is familiar and consistent and has served well, it is a wasteful arrangement when row address bits exceed column bits by more than a few bits (this began, for example, with DDR3).

Figure 3:
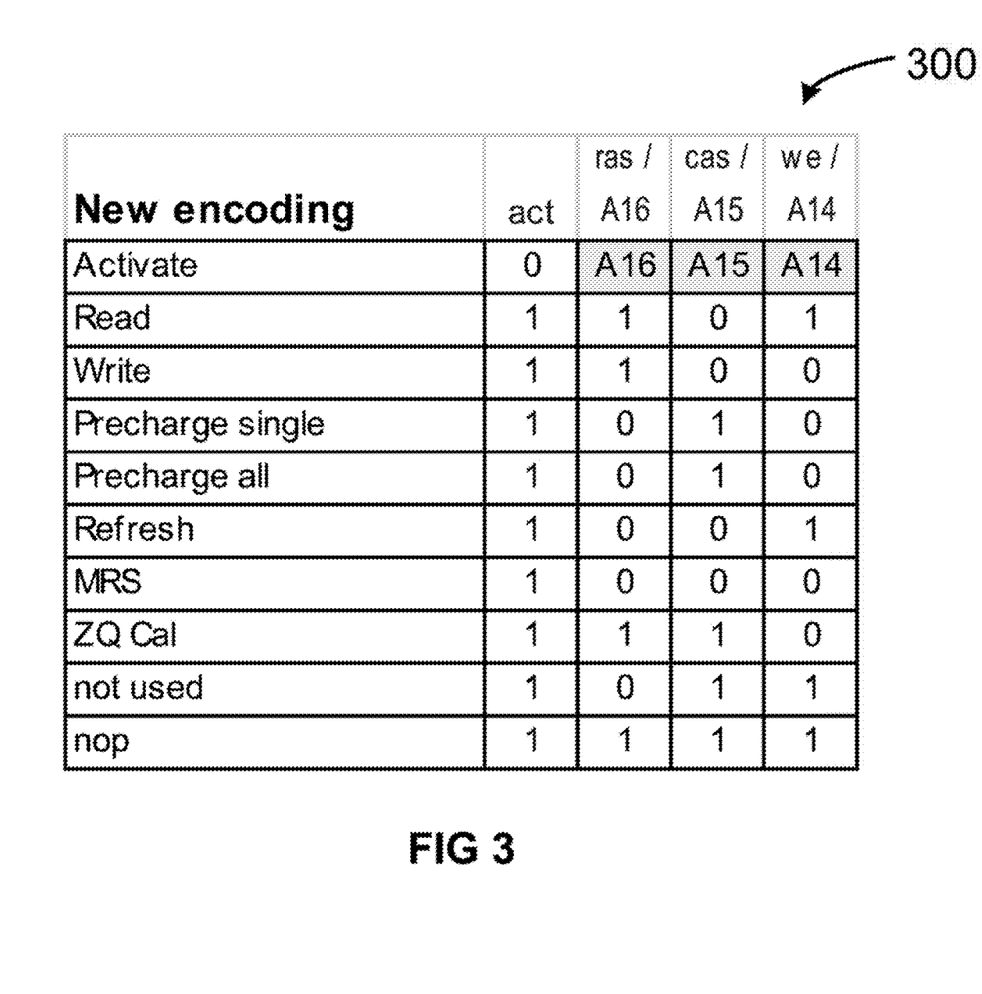
FIG. 3 illustrates a graphical representation according to some embodiments of the inventions.

FIG. 3 illustrates a graphical representation 300 of memory command signals (for example, DDR4 memory command signals) according to some embodiments. As illustrated in FIG. 3, the defined commands are one bit in length for the activate command (for example, when the ACT or ACT# signal is 0), and four bits in length (four bit encoding) for other commands.

As illustrated in FIG. 3, a new signal called ACT or ACT# uniquely identifies the activate command. When this signal is low, for example, the memory (or memories) interpret the command as an activate, and the RAS (or RAS#), CAS (or CAS#), and WE (or WE#) signals are used as address signals (for example, as address signals A16, A15, and A14, respectively in some embodiments).

When ACT# is high, RAS#, CAS#, and WE# retain their current encoding to specify seven other commands as illustrated in FIG. 3. The previous "activate" command encoding (011) is in some embodiments reserved or in some embodiments can be used by a new command type.

As evident from FIG. 3, a one bit encoding is used for the activate command and a four bit encoding is used for other commands, while the total signal count is reduced by two. When the new ACT signal is 0, it uniquely indicates an activate command. The RAS/CAS/WE signals become three row address bits during an activate since they are not required as command bits. When the new ACT signal is 1, the RAS/CAS/WE signals revert to being commands. In some embodiments, RAS/CAS/WE retain the same encoding as before, except that the previous '011' activate code is in some embodiments a reserve command that is reusable by any new command that comes along. In some embodiments, the addition of the new ACT signal and the reduction of three address signals results in a net savings of two signals.

Figure 4:
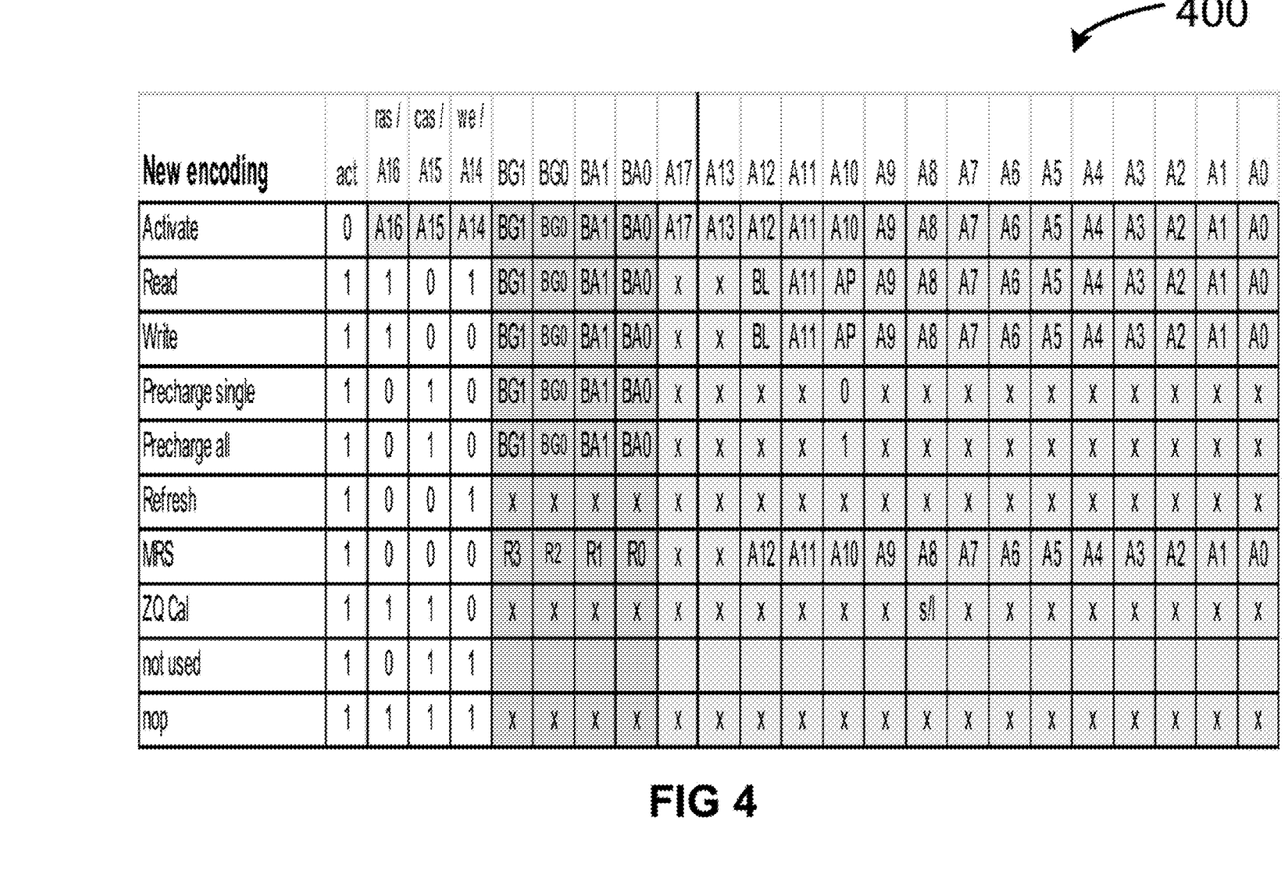
FIG. 4 illustrates a graphical representation according to some embodiments of the inventions.

FIG. 4 illustrates a graphical representation 400 of memory signals (for example, DDR4 memory signals) according to some embodiments. The graphical representation 400 is similar to and/or includes the graphical representation 300 as well as more detailed information about the signals according to some embodiments.

According to some embodiments one signal is added (ACT#) and three address signals are eliminated (for example, RAS# is combined with A16, CAS# is combined with A15, and WE# is combined with A14 according to some embodiments as illustrated in FIG. 3 and FIG. 4). This provides for a total reduction of two signals.

According to some embodiments, other address row bits other than A15, A14, and A13 are placed on the RAS#, CAS#, and WE# signals. For example, in some embodiments, the highest row address bits A17, A16, and A15 are placed on the RAS#, CAS#, and WE# signals.

However, this implementation saves two pins under conditions where all row address signals are used (the highest density). It is noted that the higher address signals are not used most of the time, however.

As discussed above, in some embodiments, the RAS#, CAS#, and WE# respectively carry A16, A15, and A14, and the two signals are saved virtually all of the time. In some embodiments (for example, in DDR4 embodiments) address signals A12 through A0 are used for read and write commands and no A15, A14, or A13 signals are necessary on any part of the interface from the memory controller or the memory socket (for example, Dual In-Line Memory Module or DIMM socket) to the memory (or memories).

According to some embodiments, command signals (for example, RAS#, CAS#, and WE#) are combined with address signals (for example, A16, A15, and A14). According to some embodiments, this combining is particularly useful in implementations where the number of row address bits exceeds the column address bits (for example, by more than one bit).

According to some embodiments, the pin count of a memory interface (for example, a DRAM interface and/or a DDR4 interface) is reduced (for example, by two signals). The reduced signal savings occurs throughout the system, such as, for example, on the memory controller (and/or processor) times the number of memory channels, on the memory socket (and/or DIMM socket), on the register device on registered memories (for example, x3 for one input, two outputs per signal), on the memories themselves, on a device for Scalable Memory Interconnect (SMI) types of interfaces, on memory buffers (times two or three depending on the number of output copies), and/or on all routing throughout the system.

According to some embodiments, a number of pins (for example, two pins) is saved. This reduction in the number of pins reduces the cost of the processor (and/or CPU), the memory socket (and/or DIMM socket), register, memories (and/or DRAM0, etc. It also saves power by having two fewer signals driven.

According to some embodiments, in order to reduce the signal count in all situations, address bits A16:A14 are multiplexed (muxed) with RAS/CAS/WE. These bits are chosen to achieve pin and power savings at most densities. According to some embodiments, a controller that need only support up to address signal A17 still achieves a savings of two signals. A controller with a fixed limit on signals can increase its memory capacity by 4x. In some embodiments, x16 DRAMS, which support only up to address signal A16, still achieves a savings of two signals. According to some embodiments, power savings begin at 4 Gbit for x4 and 8 Gbit for x8 and x16. In some embodiments A12 and below are used for column addresses (in some embodiments, A11 is actually a spare used in DDR3 but not DDR4, for example). Some commands such as MRS are restricted to A12:A0, but there are many register/bit combinations that only use up to A12 already.

According to some embodiments, when the activate command is not present (ACT is high) the RAS/CAS/WE signals retain the same encoding as previously used.

Figure 5:
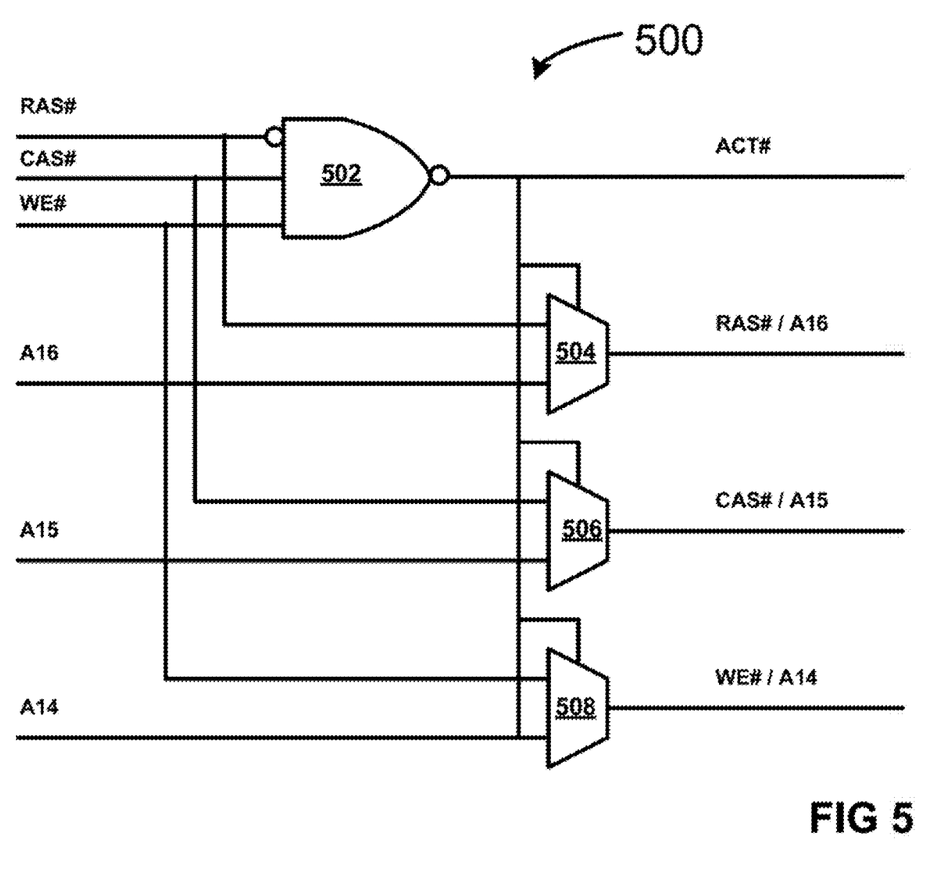
FIG. 5 illustrates logic according to some embodiments of the inventions.

FIG. 5 illustrates logic 500 according to some embodiments. In some embodiments, logic 500 comprises a selection circuit. In some embodiments, logic 500 includes a NAND gate 502, a multiplexer 504, a multiplexer 506, and a multiplexer 508. In some embodiments, logic 500 is conversion logic to convert the RAS#, CAS#, WE#, A16, A15, and A14 signals from the existing protocol to the new protocol signals ACT#, RAS#/A16, CAS#/A15, and WE#/A14, for example. In some embodiments, logic 500 is implemented in a memory controller, a processor, and/or a CPU (for example, in some embodiments, in a controller such as processor 102 and/or in memory controller 104).

Figure 6:
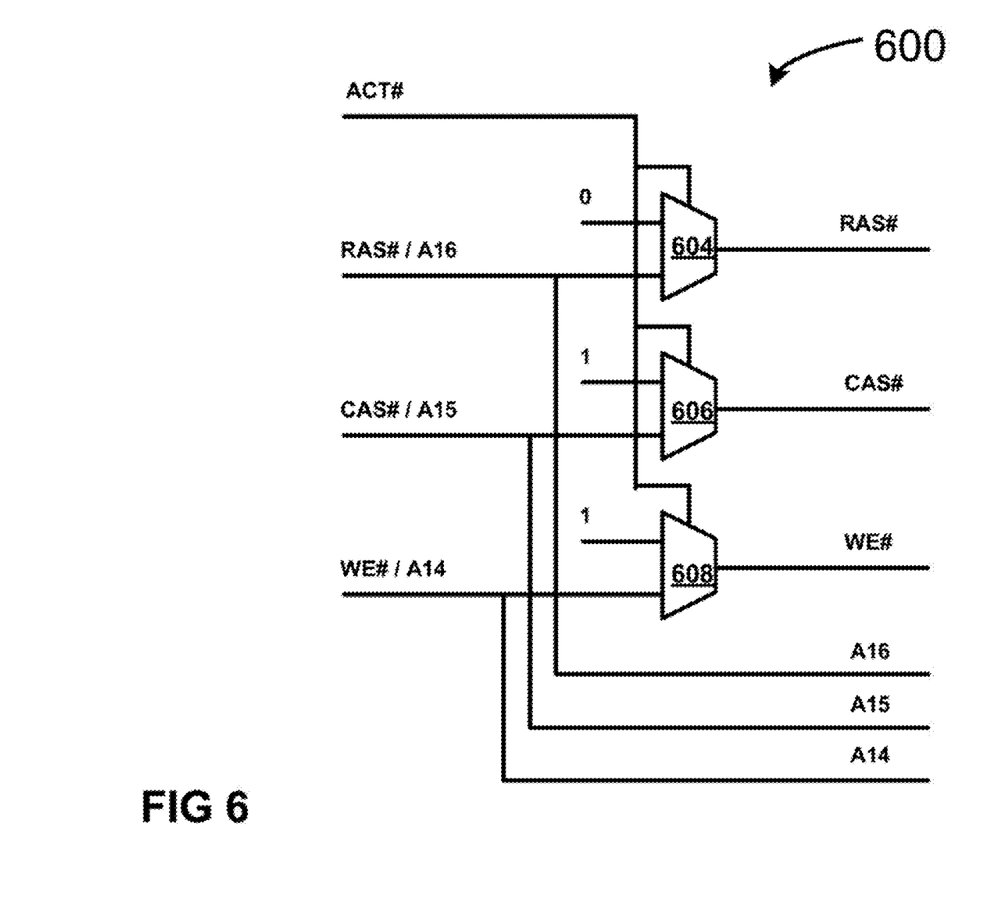
FIG. 6 illustrates logic according to some embodiments of the inventions.

FIG. 6 illustrates logic 600 according to some embodiments. In some embodiments, logic 600 comprises a selection circuit. In some embodiments, logic 600 includes a multiplexer 604, a multiplexer 606, and a multiplexer 608. In some embodiments, logic 600 is conversion logic to convert the new protocol signals ACT#, RAS#/A16, CAS#/A15, and WE#/A14 to the existing protocol signals RAS#, CAS#, WE#, A16, A15, and A14 signals, for example. In some embodiments, logic 600 is implemented in a memory controller, a processor, and/or a CPU (for example, in some embodiments, in a controller such as processor 102 and/or in memory controller 104).

According to some embodiments, two signals are saved per native memory interface. Many Intel CPUs have four DRAM interfaces, for example, which means a savings of eight signal pins plus in some embodiments four ground pins. The pins associated with the native interface are very costly to the CPU, and the savings of twelve pins is quite significant.

Although some embodiments have been described herein as being implemented in a DDR4 memory system, according to some embodiments these particular implementations are not required.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A memory apparatus comprising:
    a memory activate contact to receive an activation command signal;
    a plurality of address contacts to receive respective memory address signals;
    a plurality of multi-function contacts; and
    a selection circuit coupled to the memory activate contact and the plurality of multi-function contacts, wherein:
        the selection circuit is to interpret signals on the multi-function contacts as additional memory address signals and to implement an activate command if the activation command signal has a first value; and
        the selection circuit is to interpret the signals on the multi-function contacts as memory command signals if the activation command signal has a second value.

2. The memory apparatus of claim 1, wherein the plurality of multi-function contacts includes three contacts.

3. The memory apparatus of claim 1, wherein the memory command signals include a row address select (RAS) signal, a column address select (CAS) signal, and a write enable (WE) signal.

4. The memory apparatus of claim 1, wherein the additional memory address signals include an A14 address signal, an A15 address signal, and an A16 address signal.

5. The memory apparatus of claim 1, wherein the selection circuit is to implement another memory command indicated by the signals on the multi-function contacts if the activation command signal has the second value.

6. The memory apparatus of claim 1, further comprising a Double Data Rate 4 (DDR4) compliant memory coupled to the selection circuit to implement memory commands encoded by the memory command signals or the signals received on the multi-function contacts.

7. The memory apparatus of claim 1, wherein the memory activate contact comprises a memory activate pin and the plurality of multi-function contacts comprise a plurality of multi-function pins.

8. A memory controller comprising:
    a memory activate contact to provide an activation command signal to a memory;
    a plurality of address contacts to provide respective memory address signals to the memory;
    a plurality of multi-function contacts; and
    a control circuit coupled to the memory activate contact and the plurality of multi-function contacts, wherein:
        to indicate an activation command to the memory, the control circuit is to provide the activation command signal with a first value and provide respective additional memory address signals to the memory via the multi-function contacts; and
        to indicate a memory command that is different from the activation command to the memory, the control circuit is to provide the activation command signal with a second value and provide respective memory command signals to the memory via the multi-function contacts to indicate the memory command.

9. The memory controller of claim 8, wherein the plurality of multi-function contacts includes three contacts.

10. The memory controller of claim 8, wherein the respective memory command signals include a row address select (RAS) signal, a column address select (CAS) signal, and a write enable (WE) signal.

11. The memory controller of claim 8, wherein the respective additional memory address signals include an A14 address signal, an A15 address signal, and an A16 address signal.

12. The memory controller of claim 8, wherein the memory comprises a Double Data Rate 4 (DDR4) compliant memory.

13. The memory controller of claim 8, wherein the memory controller is included on a same die as a processor to enable the processor to communicate with the memory.

14. The memory controller of claim 8, wherein the memory controller is on a different die than a die of the memory.

15. The memory controller of claim 8, wherein the memory activate contact comprise a memory activate pin and the plurality of multi-function contacts comprise a plurality of multi-function pins.

16. A system comprising:
a processor;
a memory; and
a memory controller to communicate memory commands to the memory using an activation command signal, a plurality of address signals, and a plurality of multi-function signals, wherein the memory is to interpret the multi-function signals as memory address signals or memory command signals based on whether the activation command signal has a first value or a second value, wherein:
to indicate an activation command to the memory, the memory controller is to provide the activation command signal with a first value and provide respective additional memory address signals to the memory as the multi-function signals; and
to indicate a memory command that is different from the activation command to the memory, the memory controller is to provide the activation command signal with a second value and provide respective memory command signals to the memory as the multi-function signals.

17. The system of claim 16, wherein the plurality of multi-function signals includes three multi-function signals.

18. The system of claim 16, wherein the memory command signals include a row address select (RAS) signal, a column address select (CAS) signal, and a write enable (WE) signal.

19. The system of claim 16, wherein the respective additional memory address signals include an A14 address signal, an A15 address signal, and an A16 address signal.

20. The system of claim 16, wherein the memory is to receive the activation command signal and the plurality of multi-function signals via respective contacts.

21. The system of claim 16, wherein the memory comprises a Double Data Rate 4 (DDR4) compliant memory.

22. The system of claim 16, wherein the memory controller and the processor are included on a same die.

23. The system of claim 16, wherein the memory controller is included in the processor.

24. The system of claim 16, wherein the memory controller is on a separate die from the processor.

25. A method to be performed by a memory device, the method comprising:
receiving an activation command signal;
receiving a plurality of memory address signals;
receiving a plurality of multi-function signals;
interpreting the multi-function signals as additional memory address signals and performing an activate operation responsive to a determination that the activation command signal has a first value; and
interpreting the multi-function signals as memory command signals responsive to a determination that the activation command signal has a second value.

26. The method of claim 25, wherein the activation command signal is received on an activation command contact of the memory device and the multi-function signals are received on respective multi-function contacts of the memory device.

27. The method of claim 25, wherein the plurality of multi-function signals includes three multi-function signals.

28. The method of claim 25, wherein the memory command signals include a row address select (RAS) signal, a column address select (CAS) signal, and a write enable (WE) signal.

29. The method of claim 25, wherein the additional memory address signals include an A14 address signal, an A15 address signal, and an A16 address signal.

30. The method of claim 25, further comprising performing a memory operation other than the activate operation, as indicated by the multi-function signals, if the activation command signal has the second value.

31. The method of claim 25, wherein the memory device comprises a Double Data Rate 4 (DDR4) compliant memory device.

32. A method to be performed by a memory controller, the method comprising:
providing an activation command signal with a first value to an activation command contact of a memory and providing a plurality of memory address signals to respective multi-function contacts of the memory to indicate an activation command to the memory; and
providing the activation command signal with a second value to the activation command contact and providing a plurality of memory command signals to the respective multi-function contacts to indicate a memory command that is different from the activation command to the memory.

33. The method of claim 32, wherein the plurality of memory command signals includes three signals.

34. The method of claim 32, wherein the memory command signals include a row address select (RAS) signal, a column address select (CAS) signal, and a write enable (WE) signal.

35. The method of claim 32, wherein the memory address signals include an A14 address signal, an A15 address signal, and an A16 address signal.

36. The method of claim 32, wherein the memory comprises a Double Data Rate 4 (DDR4) compliant memory.

* * * * *